US006331807B1

(12) United States Patent
Prieto et al.

(10) Patent No.: US 6,331,807 B1
(45) Date of Patent: Dec. 18, 2001

(54) MICROWAVE COUPLER FOR A MONOLITHIC INTEGRATED CIRCUIT

(75) Inventors: Didier Prieto, Toulouse; Eric Rogeaux, Plaisance du Touch; Jean-Francois Villemazet, Cintegabelle; Thierry Parra, Toulouse, all of (FR)

(73) Assignee: Alcatel, Paris (FR)

( * ) Notice: Subject to any disclaimer, the term of this patent is extended or adjusted under 35 U.S.C. 154(b) by 0 days.

(21) Appl. No.: 09/411,227

(22) Filed: Oct. 4, 1999

(30) Foreign Application Priority Data

Oct. 5, 1998 (FR) .................................................. 98 12433

(51) Int. Cl.[7] ............................... H03H 5/00; H01P 3/08; H01P 1/00

(52) U.S. Cl. ............................ 333/128; 333/26; 333/238; 333/248

(58) Field of Search ..................................... 333/128, 248, 333/26, 238; 330/286, 295; 257/778, 664, 786

(56) References Cited

U.S. PATENT DOCUMENTS

| | | | |
|---|---|---|---|
| 3,848,198 | 11/1974 | De Brecht et al. . | |
| 5,105,171 * | 4/1992 | Wen et al. | 333/116 |
| 5,387,547 | 2/1995 | Dougherty et al. . | |
| 5,698,469 * | 12/1997 | Mohwinkel et al. | 437/205 |

FOREIGN PATENT DOCUMENTS

| | | |
|---|---|---|
| 0 880 194 A1 | 11/1998 | (EP) . |
| WO 97/17738 | 5/1997 | (WO) . |

* cited by examiner

*Primary Examiner*—Robert Pascal
*Assistant Examiner*—Kimberly E. Glenn
(74) *Attorney, Agent, or Firm*—Sughrue Mion, PLLC

(57) ABSTRACT

A balanced and active coplanar microwave coupler for an MMIC, comprising FETs provided with metal grid, source, and drain electrodes integrated with coplanar plane metal elements combined to constitute the inlet and outlet accesses of the coupler. All of the access are constituted by an association comprising one or more CPSes and one or more CPWs.

9 Claims, 4 Drawing Sheets

MICROWAVE COUPLER FOR A MONOLITHIC INTEGRATED CIRCUIT

The invention relates to a coplanar microwave coupler and more particularly to a balanced and active coplanar microwave coupler for incorporation in a monolithic microwave integrated circuit (MMIC).

BACKGROUND OF THE INVENTION

Active microwave couplers of the combiner or divider types as incorporated in MMICs used to suffer from the drawback of being relatively bulky and difficult to integrate.

A first improvement was obtained with active couplers, known as line-unified field-effect transistors (LUFETs) using field-effect transistors (FETs) having accesses unified with uniplanar interconnections. Such couplers are described in particular in the document entitled "Divider and combiner line-unified FETs as basic circuit function modules" published in September 1990 by T. TOKUMITSU et al., pp. 1210–1226, Vol. 38, No. 9, IEEE MTT.

Unifying accesses for the transistors makes it possible to take advantage of the slots formed by the metal strips constituting the electrodes of the transistors. It is thus possible to reduce the dimensions and the complexity involved in making a coupler. This also makes it possible to increase the frequency bandwidth of MMICs made in that way. Nevertheless, the resulting electrical performance, particularly in terms of insertion gain, remains limited. Furthermore, it is not always possible to integrate such a coupler directly in a more complete balanced circuit, and as a 180° combiner in a balanced mixer, for example, since such a combiner requires inlet accesses that are floating and outlet accesses referenced to ground, which is not possible with the desired coupler.

OBJECTS AND SUMMARY OF THE INVENTION

The invention thus provides a balanced and active coplanar microwave coupler for an MMIC, comprising FETs provided with metal grid, source, and drain electrodes integrated with coplanar plane metal elements combined to constitute the inlet and outlet accesses of the coupler, wherein all of the accesses are constituted by an association comprising one or more coplanar striplines (CPS) and one or more coplanar waveguides (CPW).

In a preferred embodiment of the invention, the coupler comprises a floating, central electrode obtained by using coplanar striplines in all of the accesses.

In an embodiment of the invention, the coupler includes two inlet accesses which are constituted by two coplanar waveguides each acting on half of the transistors of the coupler under the action of signals excited in phase opposition, and an outlet access which is constituted by a coplanar stripline connected to a T-junction where the intermediate signals coming from the transistors are recombined in phase.

In an embodiment of the invention, the coupler, of the divider type, includes a floating inlet obtained by adding a CPS/CPW transition.

In an embodiment of the invention, the coupler, of the combiner type, includes a floating inlet obtained by adding a coplanar stripline upstream from an inlet CPS/CPW transition of the coupler.

In an embodiment of the invention, the number of transistors in the coupler that are fed via an inlet access is equal to two or a multiple of two, with all of the transistors having either one or in the alternative two grid fingers, thereby making it possible to improve electrical performance concerning power gain.

Finally, the invention provides a monolithic integrated circuit including a coupler having at least one of the above-mentioned characteristics.

BRIEF DESCRIPTION OF THE DRAWINGS

The invention, its characteristics, and its advantages are described in greater detail below with reference to the accompanying figures, in which.

MORE DETAILED DESCRIPTION

As mentioned above, the invention relates to a balanced active microwave coupler of the coplanar type more particularly intended for incorporation in a monolithic microwave integrated circuit (MMIC). A known example of such a circuit relating to a common grid LUFET combiner is illustrated in FIG. 5*a* of the above-mentioned cited document. That circuit is not described in detail herein since it does not form part of the present invention.

The balanced active LUFET type coupler of the invention has coplanar stripline (CPS) type accesses associated with coplanar waveguides (CPWs) more particularly in an MMIC.

In known manner, a CPS has two metal strips of fixed width W which are spaced apart by a slot of fixed width S, and it operates practically in a propagation mode that makes use of the properties of transverse electromagnetic (TEM) waves unlike a conventional slotted line which operates in a propagation mode that makes use of the properties of transverse electric (TE) waves. A compromise is made concerning the width W which needs to be greater in order to minimize line losses and which also needs to be sufficiently small to eliminate the risk of non-TEM parasitic phenomena and to keep the area required for the MMIC as small as possible. This is developed in particular in the document entitled "CPS structure potentialities for MMICs: a CPS/CPW transition and a bias network" published in 1998 by D. PRIETO et al. at pages 111 to 114 of IEEE MIT-S Digest.

In parallel, the width Wm of the CPW ground planes can be reduced to a value that is less than half the distance between the ground planes without propagation characteristics being influenced unfavorably.

Figure 1:
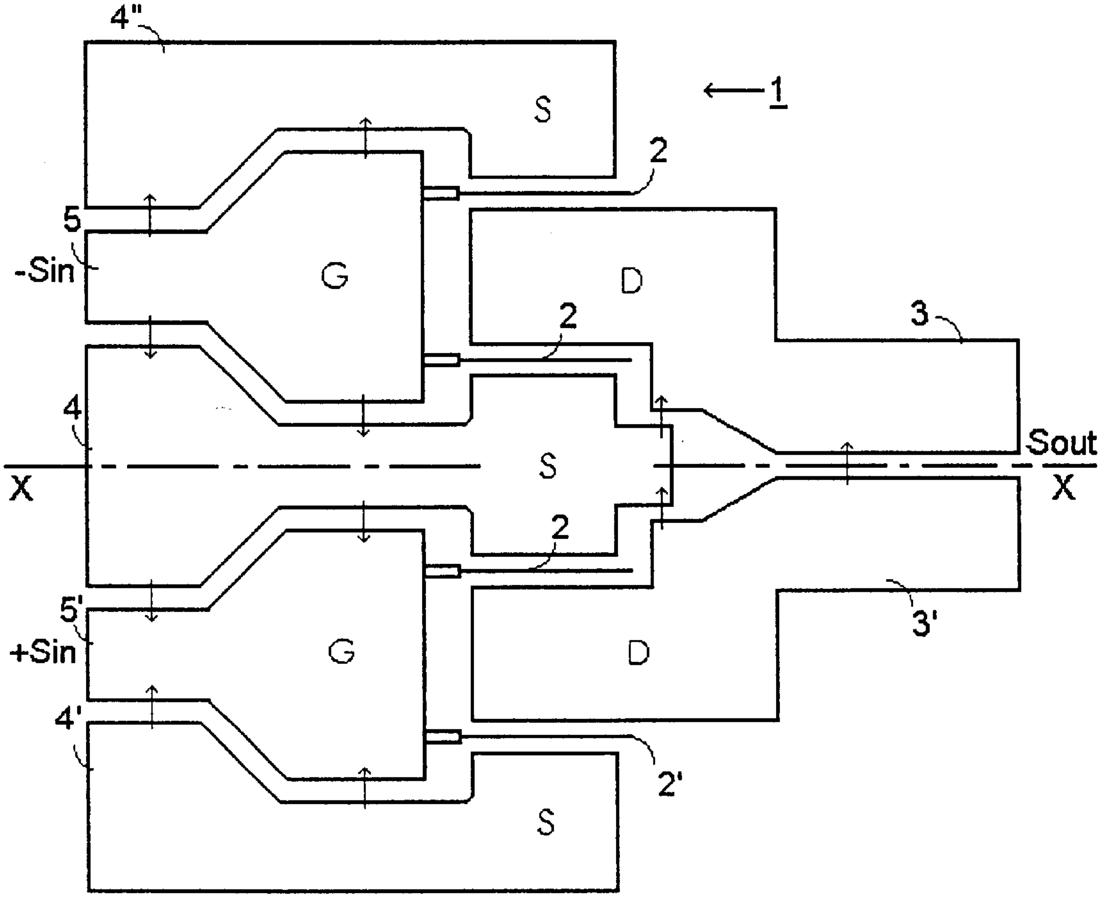
FIG. 1 is a diagram representing the main mask elements for a combiner of the invention.

The balanced active coupler 1, shown diagrammatically in FIG. 1, can be made on an area of 330×240 $\mu m^2$, for example. This coupler is a 180° power combiner, and it has field-effect transistors (FETs). Only the metal strips giving access to the grid G, drain D, and source S electrodes are shown, these strips usually being situated above the transistors with which they are associated in the structure constituting the MMIC.

Figure 4:
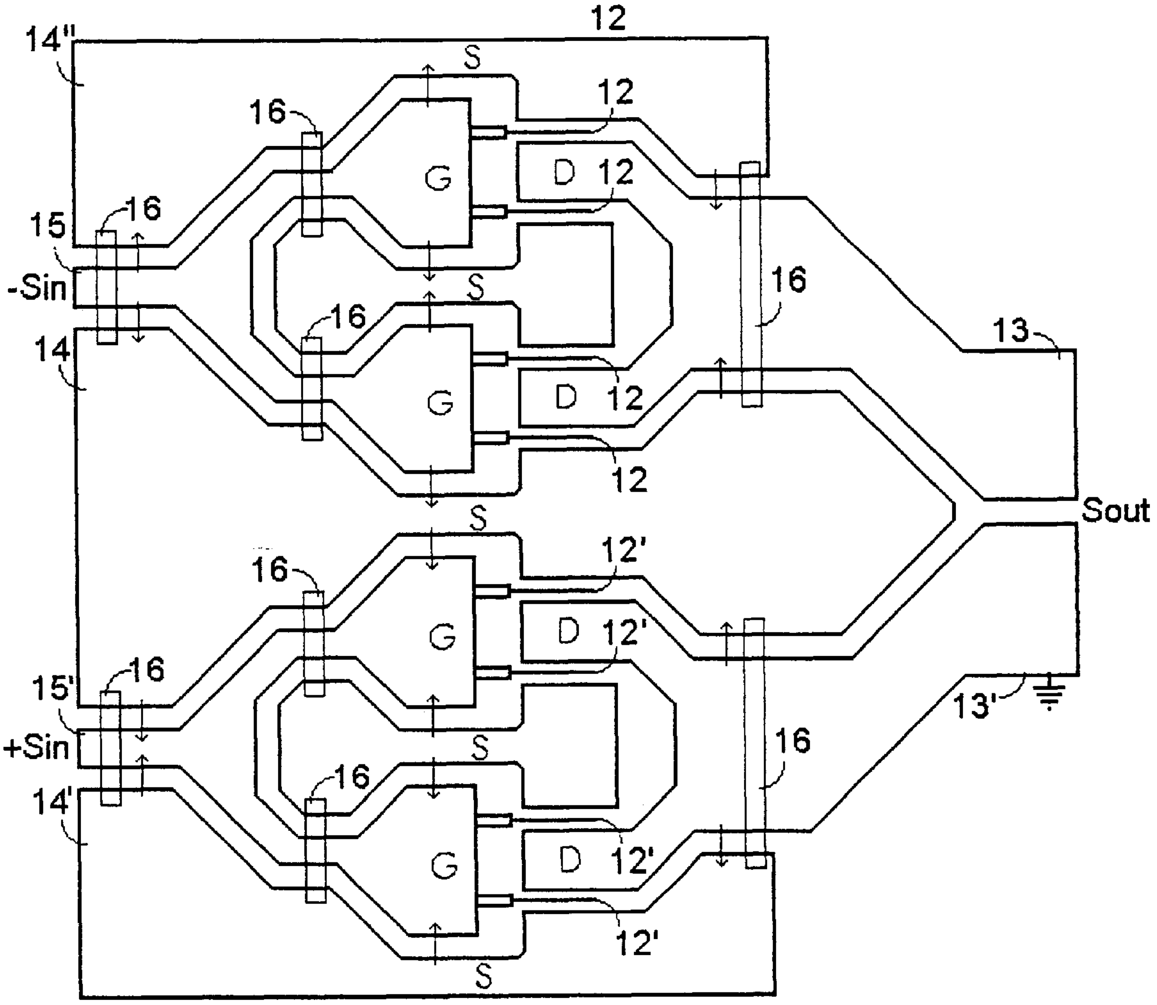
FIG. 4 is a diagram showing the main mask elements for a FIG. 3 combiner provided with outlet access lines of a mixer.

The coupler has four FETs with single grid fingers or two FETs with two grid fingers each. In this case, the transistors are disposed symmetrically about a mid-longitudinal axis XX of the mask shown diagrammatically. Each grid finger 2 is positioned between the drain and source electrodes integrated with the metal strip elements that are referenced 3 or 3' for the drains, 4, 4', or 4" for the sources. Increasing the number of FETs makes it possible to obtain power gain, as shown in FIG. 4.

Two inlet accesses are provided to the coupler 1, each constituting a coplanar CPW connected to two FETs. One of the accesses is made up of the source elements 4 and 4" together with a grid element 5, and the other is made up of the source elements 4 and 4' together with a grid element 5. The source element 4 is common to both waveguides.

The combiner constituted by the coupler 1 receives two input signals simultaneously that are excited in phase opposition by the two coplanar waveguides whose inlets are referenced "−Sin" and "+Sin" in FIG. 1. Isolation between these inlets is provided in this case by the active portions of the FETs. Intermediate outlet signals are respectively obtained between the elements forming the source and drain electrodes for the FETs. An outlet coplanar stripline is constituted by the two metal strips having access to the drain electrodes. The intermediate signals recombine in phase via a CPS T-junction.

The outlet coplanar stripline from this junction serves to reduce the dispersive nature of the resulting circuit. It transmits the signal obtained after recombination to the outlet Sout of the combiner and it is referenced to ground in this case. The electric field between the strips is represented diagrammatically by the arrows placed in FIG. 1.

From evaluations performed by simulation, gain greater than +1 dB in forward transmission and greater than −20 dB in reverse transmission has been obtained between an inlet signal and the outlet signal, together with isolation less than −10 dB between the two input signals in an extended frequency range going up to 20 GHz. Similarly, power gain of about +10 dB is obtained for a frequency of 11 GHz, when the inlet accesses are excited simultaneously by two signals in phase opposition.

Figure 2:
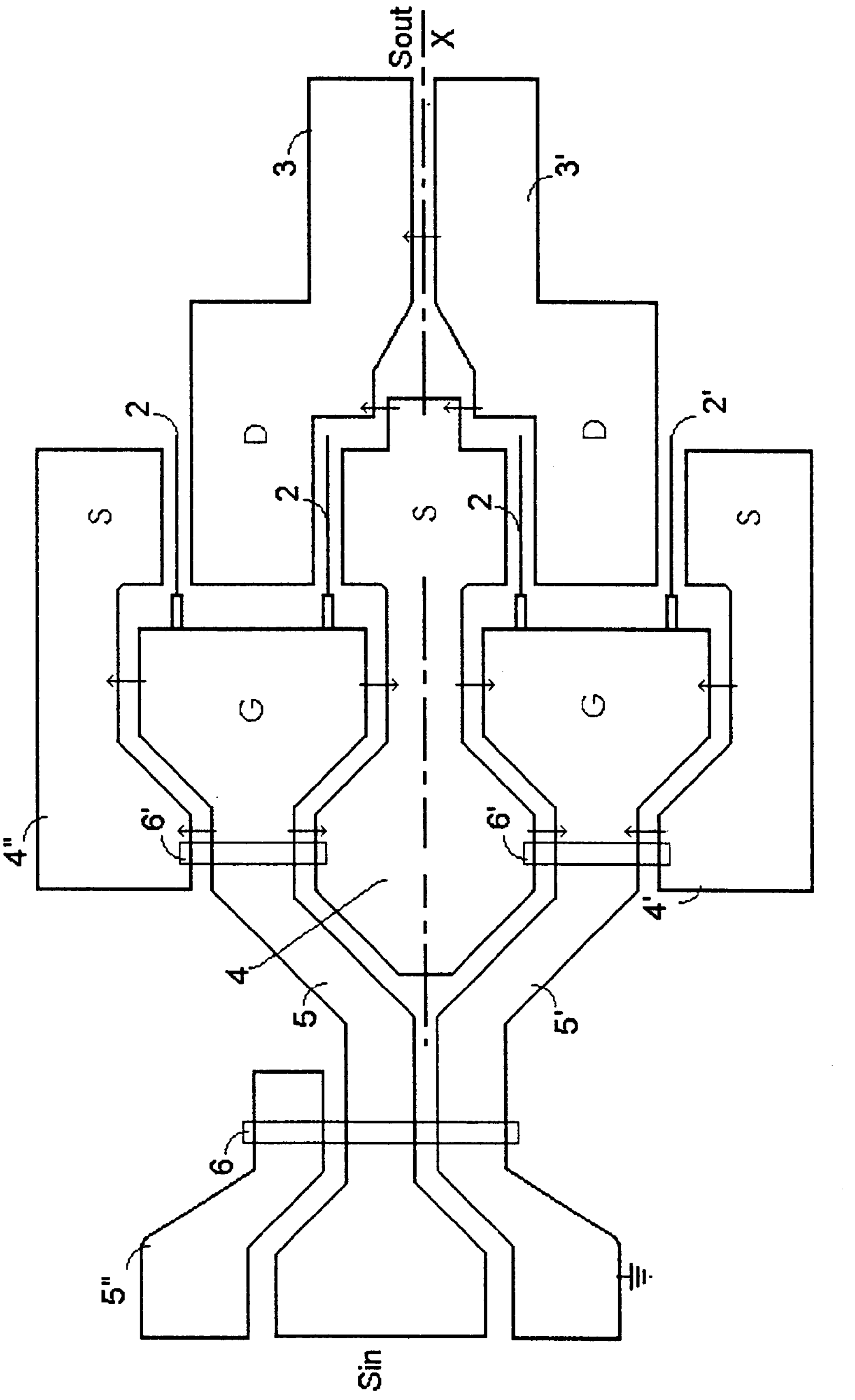
FIG. 2 is a diagram showing the main mask elements for a divider of the invention.

Although the circuit described with reference to FIG. 1 is developed as a combiner, it should be understood that it can also be used as a power divider by transforming the two floating inlet CPWs into a floating CPS. Such a power divider is shown in FIG. 2 for the case where the outlet coplanar stripline of the coupler is connected to the inlet of a mixer (not shown).

An additional metal strip element 5" is added to the strip elements which extend the elements 5 and 5' at the inlet to the coupler so as to constitute the second grounded element of the inlet CPW with which the coupler is now fitted. The two elements 5' and 5" are interconnected by an air bridge 6, the two source elements 4' and 4" being likewise interconnected with the source element 4 by air bridges 6'.

Figure 3:
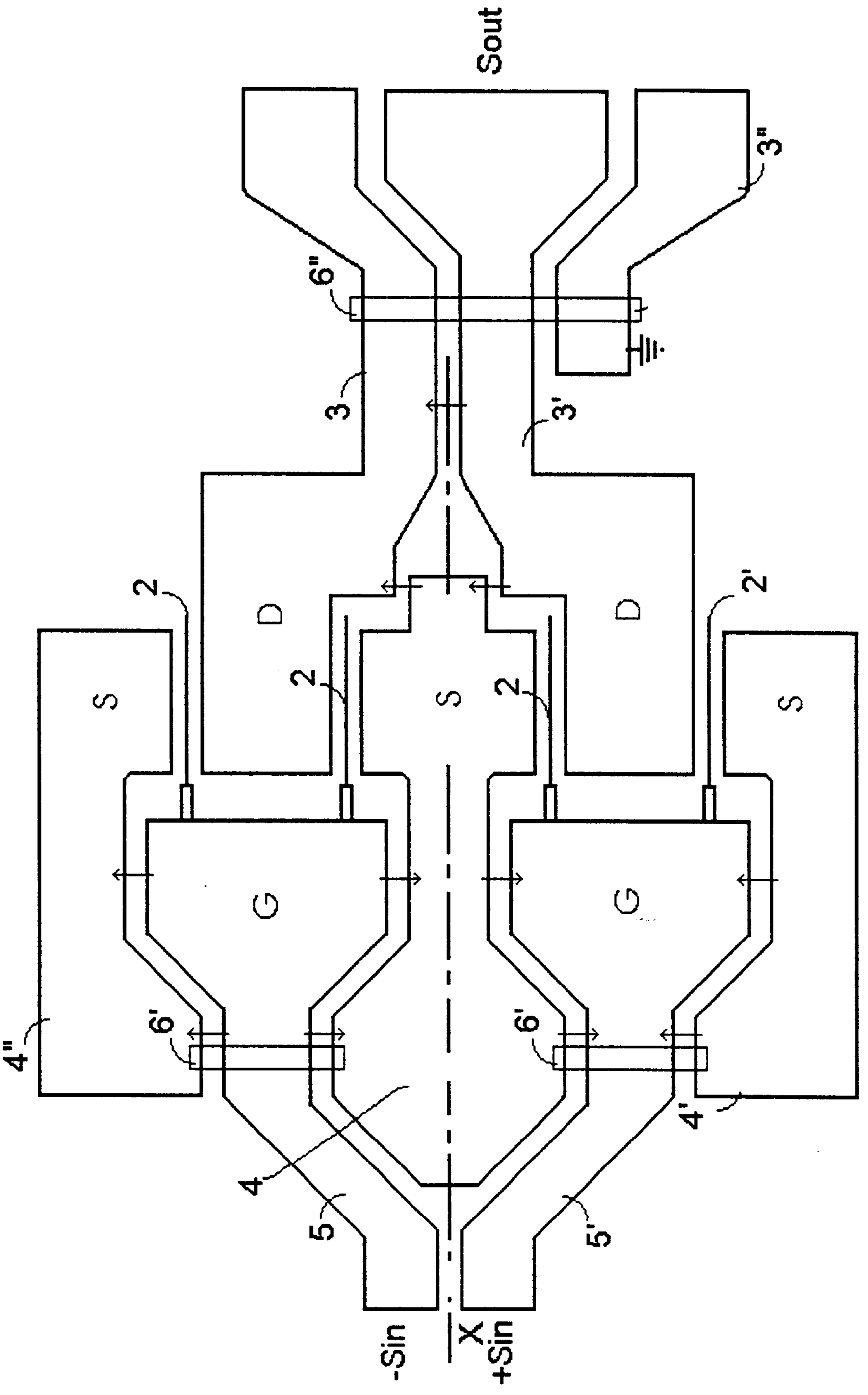
FIG. 3 is a diagram showing the main mask elements for a variant combiner of the invention.

The application of a coupler of the invention to a 180° power combiner located at the outlet from a balanced mixer is shown in FIG. 3. The coupler shown in FIG. 2 is then associated with an outlet CPW and it is fed by the mixer (not shown) via a CPS obtained by extending the elements 5 and 5'. An additional metal strip element 3" is added to the elements 3 and 3' at the outlet from the coupler to constitute the second ground element of the outlet CPW with which the coupler is now fitted. The two elements 3 and 3" are interconnected by an air bridge 6", and the two source elements 4' and 4" are likewise connected to the source element 4 by air bridges 6'. The resulting power combiner which has a grounded outlet CPW is thus provided with two floating differential inputs.

The variant embodiment shown in FIG. 4 relates to a combiner of greater power which is obtained by duplicating the combiner shown in FIG. 1 and which makes it possible to improve electrical performance concerning gain and linearity of the power characteristic.

The coupler has eight FETs 12 or 12' with single grid fingers or four FETs with two grid fingers each. In this case, the transistors are placed symmetrically about the mid-longitudinal axis XX of the mask shown. Each grid finger 12 is positioned between two metal strip elements, one of them being a drain element 13 or 13' and the other a source element 14, 14', or 14". Increasing the number of FETs makes it possible to obtain power gain as already mentioned.

Two inlet accesses are provided for the coupler, each constituting a CPW connected to four FETs. One is made up of the source elements 14 and 14" together with a grid element 15, and the other from the source elements 14 and 14' together with a grid element 15'. The source element 14 is common to both waveguides.

Two input signals excited in phase opposition are transmitted by the two coplanar waveguides whose inputs are referenced "−Sin" and "+Sin".

Each of the CPWs forming the inlet accesses of the coupler is split into two internal coplanar striplines.

A CPS/CPW T-junction is made in the coupler at each access between the waveguides and the coplanar striplines giving access to the FETs to enable the signal received from the access in question to be transmitted to said transistors. These transistors are either two of the four transistors of the coupler that have two grid fingers or else four of the eight transistors that have single grid fingers, depending on the option selected.

As before, intermediate outlet signals are obtained respectively between the elements relating to the source and drain electrodes of the FETs. The intermediate signals respectively obtained for each access are transmitted via the CPWs and via one CPW/CPS transition per access. These intermediate signals are recombined in phase at the CPS T-junction. The outlet signal Sout is obtained from the outlet coplanar stripline of the junction.

The operation of this combiner corresponds to that of the combiner described with reference to FIG. 1. Two input signals "−Sin" and "+Sin" in phase opposition are applied simultaneously to respective ones of the two grid assemblies. Outlet gain and saturation power values of 6.8 dB and 11.5 dBm respectively can be obtained at 11 GHz instead of 3.5 dB and 5.9 dBm for the combiner shown in FIG. 1.

What is claimed is:

1. A balanced and active coplanar microwave coupler for an MMIC, said coupler comprising:

a plurality of FETs provided with metal grid, source, and drain electrodes, said grid, source and drain electrodes comprising coplanar metal elements combined to constitute the inlet and outlet accesses of the coupler, wherein all of the accesses are constituted by one or more coplanar striplines (CPS) and one or more coplanar waveguides (CPW) formed by said coplanar elements.

2. A coupler according to claim 1, including a floating, central electrode obtained by using coplanar striplines in all of the accesses.

3. A coupler according to claim 1, including two inlet accesses which are constituted by two coplanar waveguides each acting on half of the transistors of the coupler under the action of signals excited in phase opposition, and an outlet access which is constituted by a coplanar stripline connected to a T-junction where the intermediate signals coming from the transistors are recombined in phase.

4. A coupler according to claim 1, wherein said coupler is configured as a divider type coupler, including a floating inlet obtained by adding a CPS/CPW transition.

5. A coupler according to claim 4, including an inlet coplanar waveguide placed upstream which is obtained by adding an additional ground metal element in parallel with the two elements of the inlet coplanar stripline, one of which elements is referenced to ground.

6. A coupler according to claim 1, wherein said coupler is configured as a combiner type coupler, including a floating inlet obtained by adding a coplanar stripline upstream from an inlet CPS/CPW transition of the coupler.

7. A coupler according to claim 6, including an outlet CPW which is obtained by adding an additional ground metal element in parallel with the two elements of the outlet coplanar stripline, one of which elements is referenced to ground.

8. A coupler according to claim 1, in which the number of transistors fed via an inlet access is equal to two or to a multiple of two, all of the transistors having either one or two grid fingers.

9. A monolithic microwave integrated circuit including a microwave coupler according to claim 1.

* * * * *